United States Patent
Halder et al.

(10) Patent No.: US 10,892,770 B2
(45) Date of Patent: Jan. 12, 2021

(54) NOISE SHAPING IN A DIGITAL-TO-ANALOG CONVERTOR

(71) Applicant: TEXAS INSTRUMENTS INCORPORATED, Dallas, TX (US)

(72) Inventors: Tanmay Halder, Kolkata (IN); Anand Kannan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/668,744

(22) Filed: Oct. 30, 2019

(65) Prior Publication Data
US 2020/0136638 A1  Apr. 30, 2020

(30) Foreign Application Priority Data

Oct. 31, 2018  (IN) .............................. 201841041199

(51) Int. Cl.
| | |
|---|---|
| H03M 1/66 | (2006.01) |
| H03M 1/44 | (2006.01) |
| H03M 1/12 | (2006.01) |
| H03M 3/00 | (2006.01) |
| H03M 1/00 | (2006.01) |

(52) U.S. Cl.
CPC ........... *H03M 1/442* (2013.01); *H03M 1/124* (2013.01); *H03M 1/66* (2013.01); *H03M 1/00* (2013.01); *H03M 1/12* (2013.01); *H03M 3/30* (2013.01)

(58) Field of Classification Search
CPC ............ H03M 1/66; H03M 3/30; H03M 1/00; H03M 1/12
USPC ................................. 341/144, 145, 143, 155
See application file for complete search history.

(56) References Cited

U.S. PATENT DOCUMENTS

2014/0167993 A1*  6/2014  Chiang .................. H03M 1/089
                                                                    341/143

* cited by examiner

*Primary Examiner* — Joseph J Lauture
(74) *Attorney, Agent, or Firm* — John R. Pessetto; Charles A. Brill; Frank D. Cimino (57) ABSTRACT

Systems and methods are disclosed for a signal convertor comprising a resistor or current source coupled to a positive virtual ground node and a negative virtual ground node, wherein the resistor or current source is configured to switch from the positive virtual ground node (VGP) to the negative virtual ground node (VGN), wherein the switching of the resistor or current source results in a shaping of the low frequency noise from the resistor.

20 Claims, 7 Drawing Sheets

NOISE SHAPING IN A DIGITAL-TO-ANALOG CONVERTOR

CROSS-REFERENCE TO RELATED APPLICATIONS

This application claims priority to Indian Provisional Application No. 201841041199, filed Oct. 31, 2018, which is hereby incorporated by reference.

BACKGROUND

Low frequency noise from a resistor and/or current steering digital-to-analog convertor ("DAC") is a concern in electronics designs that benefit from low lost, low area, and high performance. Some solutions to this problem include increasing the size of the resistors or current sources or use expensive elements that increase the costs associated with the design. For example, some solutions may incorporate elements that do not have flicker noise, such as silicon chromium (Si—Cr) resistors, that increase the costs associated with the electrical design.

SUMMARY

Systems and methods are disclosed for a resistor or current source coupled to a positive virtual ground node and a negative virtual ground node, wherein the resistor or current source is configured to switch from the positive virtual ground node (VGP) to the negative virtual ground node (VGN), wherein the switching of the resistor results in a shaping of the low frequency noise from the resistor leading to an overall decrease in noise in the signal band

BRIEF DESCRIPTION OF THE DRAWINGS

For a detailed description of various examples, reference will now be made to the accompanying drawings in which.

DETAILED DESCRIPTION

There are numerous applications for digital-to-analog convertors ("DACs"), which are routinely used to convert a digital representation into an analog electrical signal. However, one byproduct of this conversion is the production of flicker noise, a low-frequency noise, from the non-ideal components such as resistors or current sources that often are used in a DAC. That low frequency noise reduces system performance. As explained herein, the systems and methods described alleviate that problem.

Figure 1:
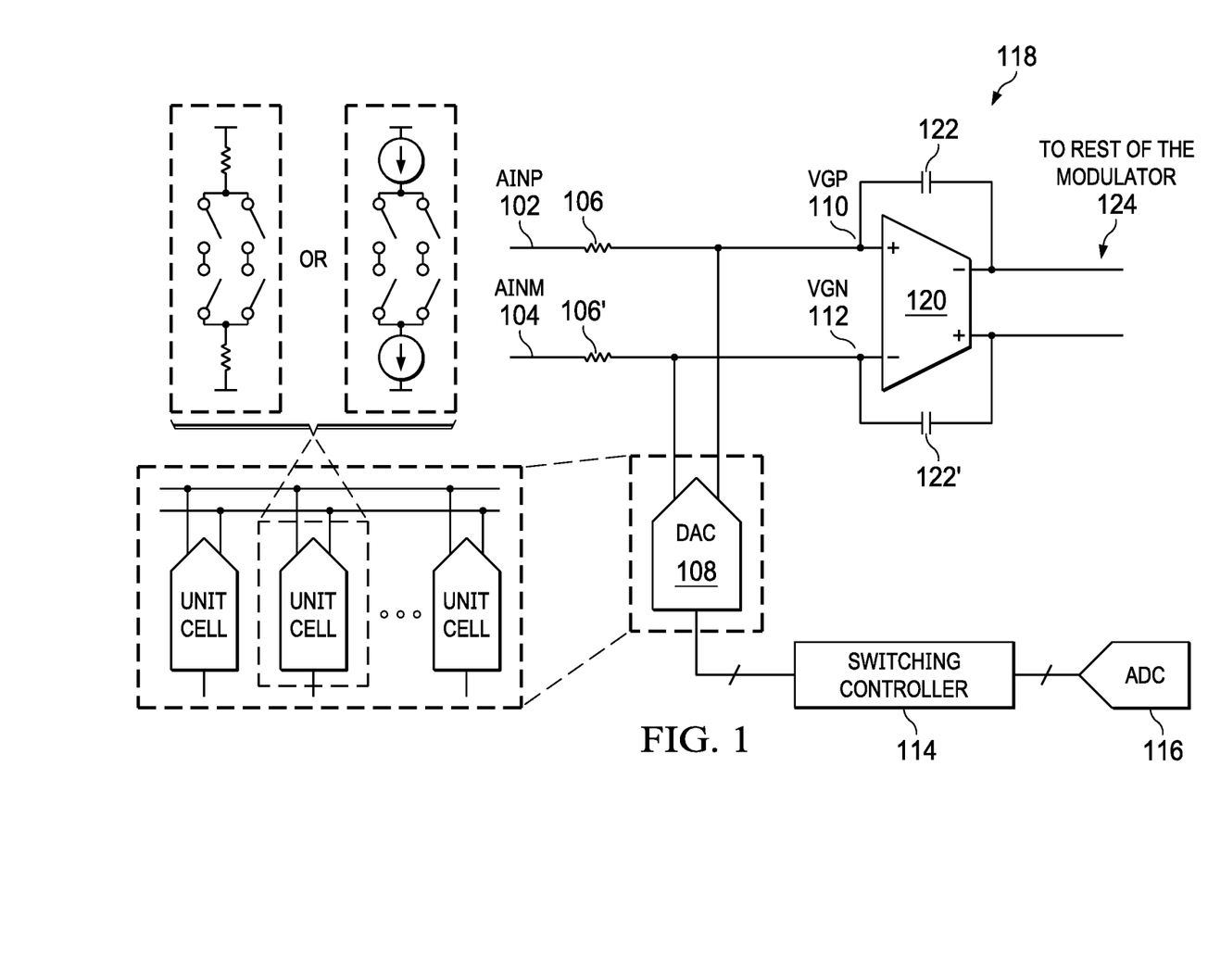
FIG. 1 illustrates a system in which low frequency noise is shaped using both a particular connection (hereinafter called virtual ground connection) and a switching sequence implemented using a switching controller on the digital-to-analog converter ("DAC")

The objectives of the systems and methods described herein include reducing flicker noise at a signal convertor through the use of switching algorithms implemented at a DAC. FIG. 1 is an example of a system including a DAC 108 in which low frequency noise is reduced prior to being transmitted to a modulator. As will be explained below, the system reduces low frequency noise at a signal convertor by shaping it and may include various applications. At "AINP" 102 and "AINM" 104, the system receives input from the positive and negative input terminals, respectively. Each input transmission AINP 102 and AINM 104 passes through a resistor 106, 106'. A digital-to-analog convertor (DAC) 108 is coupled to each input 102, 104 downstream of the resistors 106, 106'. The DAC 108 is comprised of a number of unit elements, for example, resistors or current sources, as will be explained in greater detail herein. The DAC 108 is responsible for converting a digital signal to an analog signal and implementing the switching algorithms that are used to reduce flicker noise signal. Each unit cell of the DAC 108 places one or more switches on a positive virtual ground node (VGP) 110 and one or more switches on a negative virtual ground node (VGN) 112. By engaging and disengaging the switches on the positive virtual ground node (VGP) 110 and the switches on the negative virtual ground node (VGN) 112 in a particular sequence, the DAC 108 is able to shape the low frequency noise from the unit elements. That switching is performed by the switching controller 114, which is also coupled to the DAC 108. The switching controller 114 is further coupled to the analog-to-digital convertor (ADC) 116 that outputs the digital signal. The flicker noise signal is a slow-moving phenomenon. As such, by switching quickly between the positive virtual ground node (VGP) 110 and the negative virtual ground node (VGN) 112, the flicker noise signal can be differentially canceled out or reduced to an acceptable level.

Downstream of the positive virtual ground node (VGP) 110 and the negative virtual ground node (VGN) 112, there is an integrator 118 comprised of an operational amplifier 120 and capacitors 122, 122'. Using that architecture, the resistors that comprise the DAC 108 are switched from the positive virtual ground node (VGP) 110 to the negative virtual ground node (VGN) 112 using a noise-shaping switching algorithm. That switching algorithm, which executes switching faster than the flicker noise corner frequency, shapes the noise as it switches between the positive virtual ground node (VGP) 110 and the negative virtual ground node (VGN) 112, thereby differentially canceling flicker noise. Following that noise cancellation, the signal passes through the integrator 118 and is transmitted to the back-end of the modulator 124.

Figure 2:
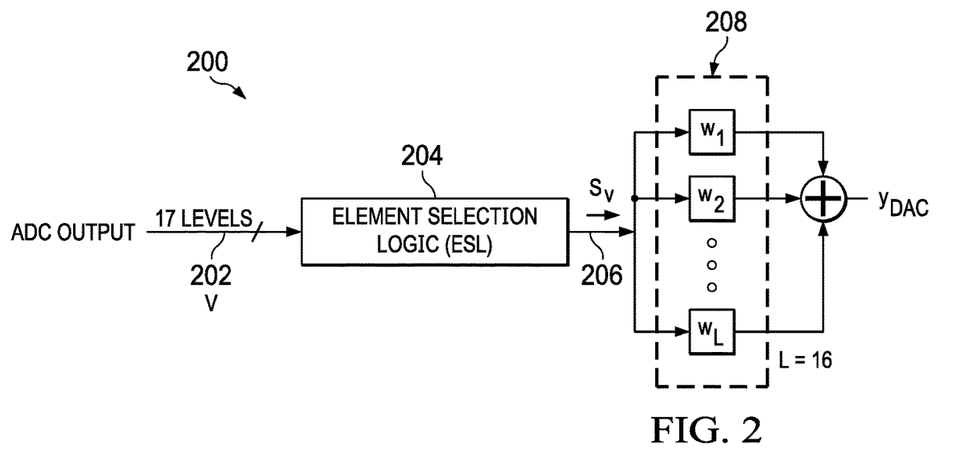
FIG. 2 is an example block diagram of the DAC architecture

FIG. 2 shows the feedback DAC structure 200 in accordance with the techniques described herein. As shown "V" 202 is the output of the quantizer. The digital input is given to the element selection logic module (ESL) 204, which generates a vector "Sv" 206 comprised of 1's and 0's to select the unit element $w_1, w_2, \ldots, w_L$ 208 of the DAC 200 such that:

$$v = \sum_{k=1}^{L} \vec{S_v}[k].$$

The DAC unit elements are comprised of resistors and switches. Based on the element selected, the resistor is either switched to VGP or to VGM. The element selection logic module 204, if selected properly and coupled with the virtual ground switching, will shape the low frequency noise in the resistors. The shaped out low frequency noise can be removed by the digital filter that follows the modulator which may need to be present for removal of the out-of-band quantization noise. The element selection logic module 204 is comprised of an algorithm that shapes out the static error.

Figure 3A:
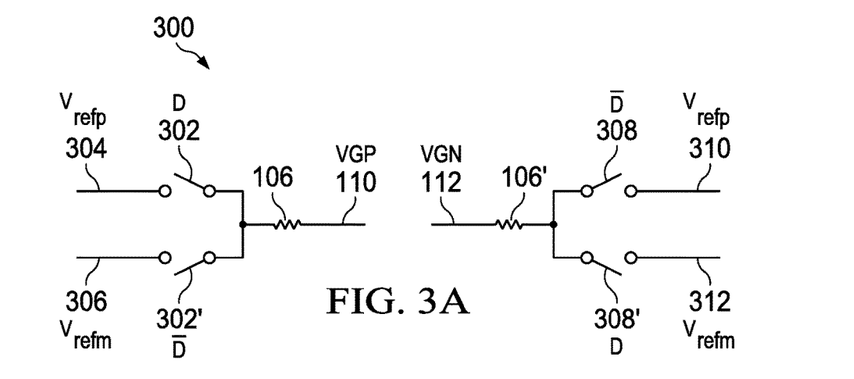
FIG. 3A is an example diagram of a DAC unit cell switching on the reference node.

FIG. 3A is a diagram of a DAC unit cell switching on the reference node. As explained above, the DAC 108 is comprised of a plurality of DAC unit cells. In the diagram of FIG. 3A, the process followed by one of those unit cells is shown. In the unit cell 300 shown, input is switched using the transistor switches 302, 302' from $V_{refp}$ 304 to $V_{refm}$ 306 on the resistor 106. Similarly, input is switched using the transistor switches 308', 308 from $V_{refm}$ 312 to $V_{refp}$ 310 on the resistor 106'. Hence, resistor 106 is always connected to VGP and resistor 106' is always connected to VGN. This implies that the flicker noise from these elements are not switched and pass through to the output of the integrator and the ADC. As a result, the resistor 106 may be an order of magnitude wider and hence larger area than what is permissible to achieve similar flicker noise reduction using the techniques described here.

Figure 3B:
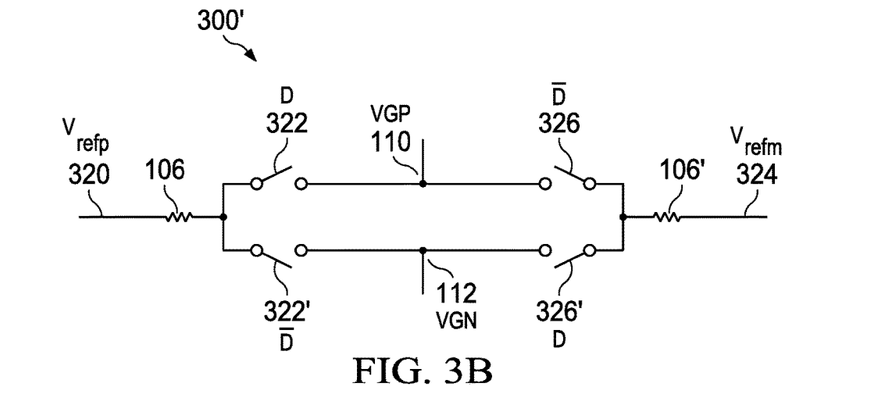
FIG. 3B is an example diagram of a DAC unit cell switching on the virtual ground node.

FIG. 3B is a diagram of a DAC unit cell switching on the virtual ground node, a system that incorporates the techniques disclosed herein to reduce flicker noise. In the unit cell 300' shown, input is switched from the positive virtual ground node (VGP) 110 to the negative virtual ground node (VGN) 112 using the transistor switches 322, 322' on the resistor 106 at $V_{refp}$ 320, while also being switched from the negative virtual ground node (VGN) 112 to the positive virtual ground node (VGP) 110 using the transistor switches 326', 326 from $V_{refm}$ 324 at resistor 106'. The switching of the transistors may be controlled by a control signal, for example, from the switching controller 114. Hence, resistors 106 and 106' are always switched between VGP and VGN differentially. This implies that the flicker noise from these elements are also switched and hence only the differentiated flicker noise passes through to the output of the integrator and the ADC. This implies that the flicker noise is shaped or that the low frequency noise is greatly attenuated. That implementation also uses the noise-shaping switching algorithm to cancel the flicker noise. As a result, the resistor width may be reduced by an order of magnitude (e.g. from 0.3 um to 0.02 um) to meet the flicker noise requirements.

Figure 4:
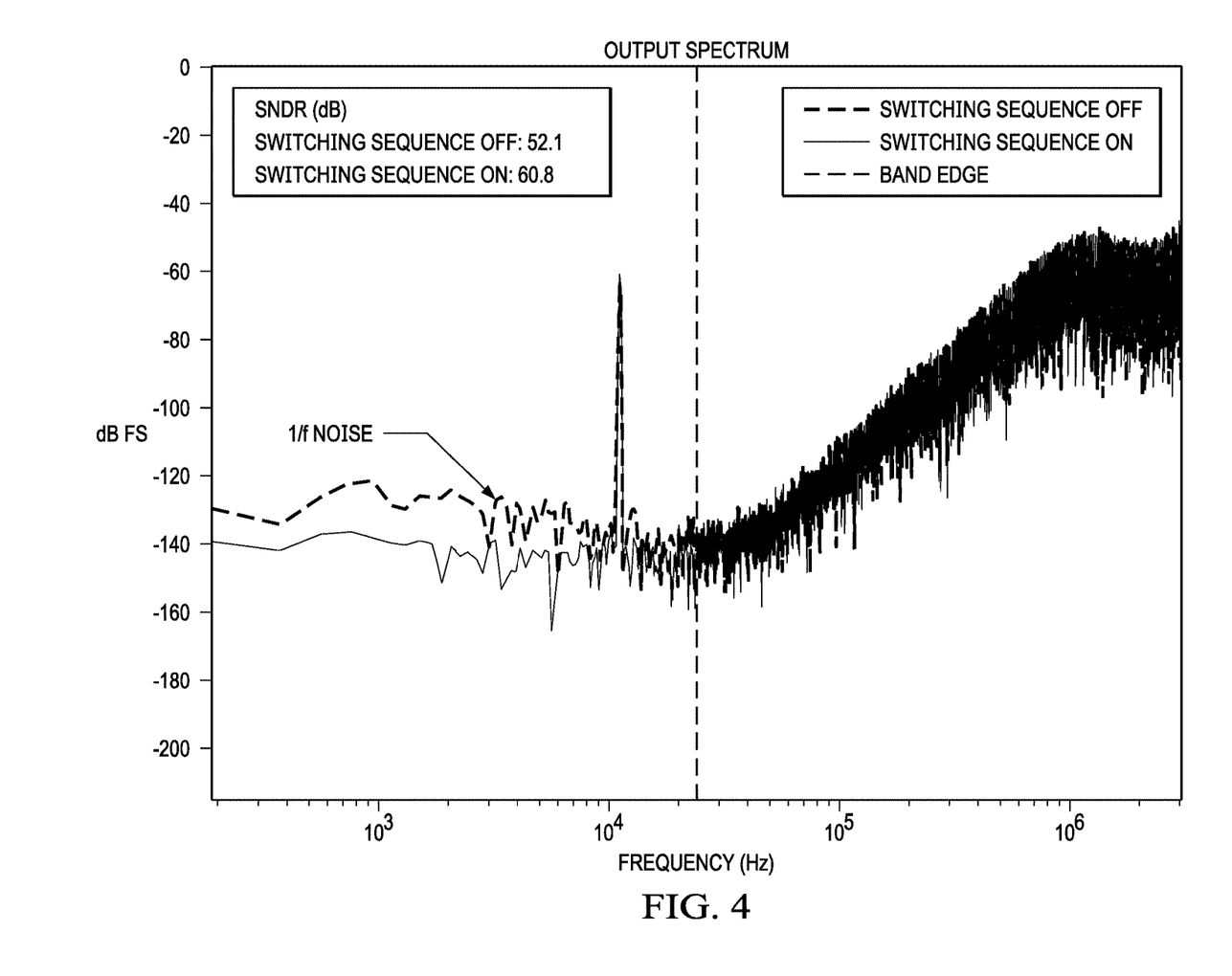
FIG. 4 is an example output spectrum showing reduction of low frequency noise with virtual ground switching with the aid of the switching sequence.

FIG. 4 is an example of an output spectrum showing flicker noise with and without the techniques described herein. The resistor used has a consistent width of 0.15 um, with a process geometry limitation yielding a ~8.5 dB better SNDR with the techniques described herein, where thermal noise is limiting in this implementation. The output spectrum shows the shaping of flicker noise with a −60 dBFS input signal. The "Switching Sequence OFF" line represents an output spectrum that does not use a switching algorithm for flicker noise shaping. That results in a SNDR output of 52.1 dB. The "Switching Sequence ON" line represents an output spectrum that does use a switching algorithm for low frequency noise shaping. Using the algorithm along with "virtual ground switching" results in a SNDR output of 60.8 dB, an over 8.5 dB improvement in noise reduction.

Figure 5:
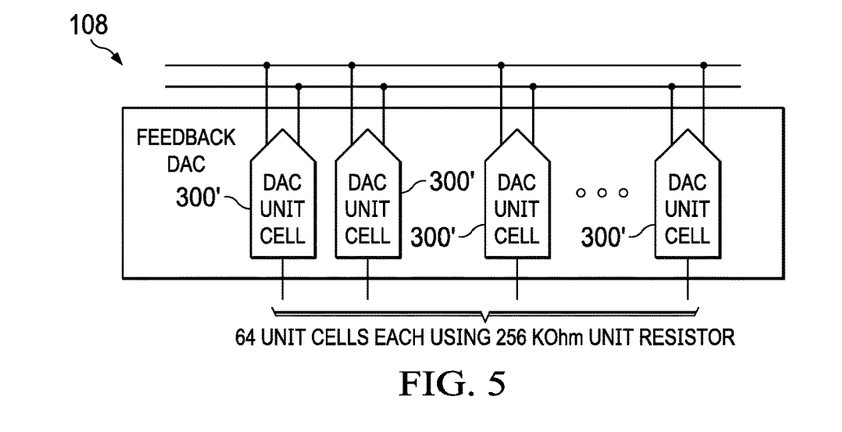
FIG. 5 is an example diagram of multiple DAC unit cells that comprise a DAC.

FIG. 5 is a diagram of multiple DAC unit cells that comprise at least part of DAC 108. As shown in FIG. 5, the DAC unit cells 300' are aligned innode DAC 108. The DAC unit cells 300' may comprise resistors or current sources (e.g., transistors configured for a predefined level of drain current). In one example, DAC 108 includes 64-unit cells 300'. In one implementation that does not use the flicker noise-reducing techniques described herein, the unit cells may comprise a total area of 840 um² in order to meet the flicker noise requirements of the system. By using the techniques described herein, however, for the same level of DAC precision and accuracy, the area of the unit cell 300' may be reduced to 498 um², which is an approximately 40% area reduction. Further area reduction is also possible using the techniques described herein by further optimizing the process geometry.

Figure 6:
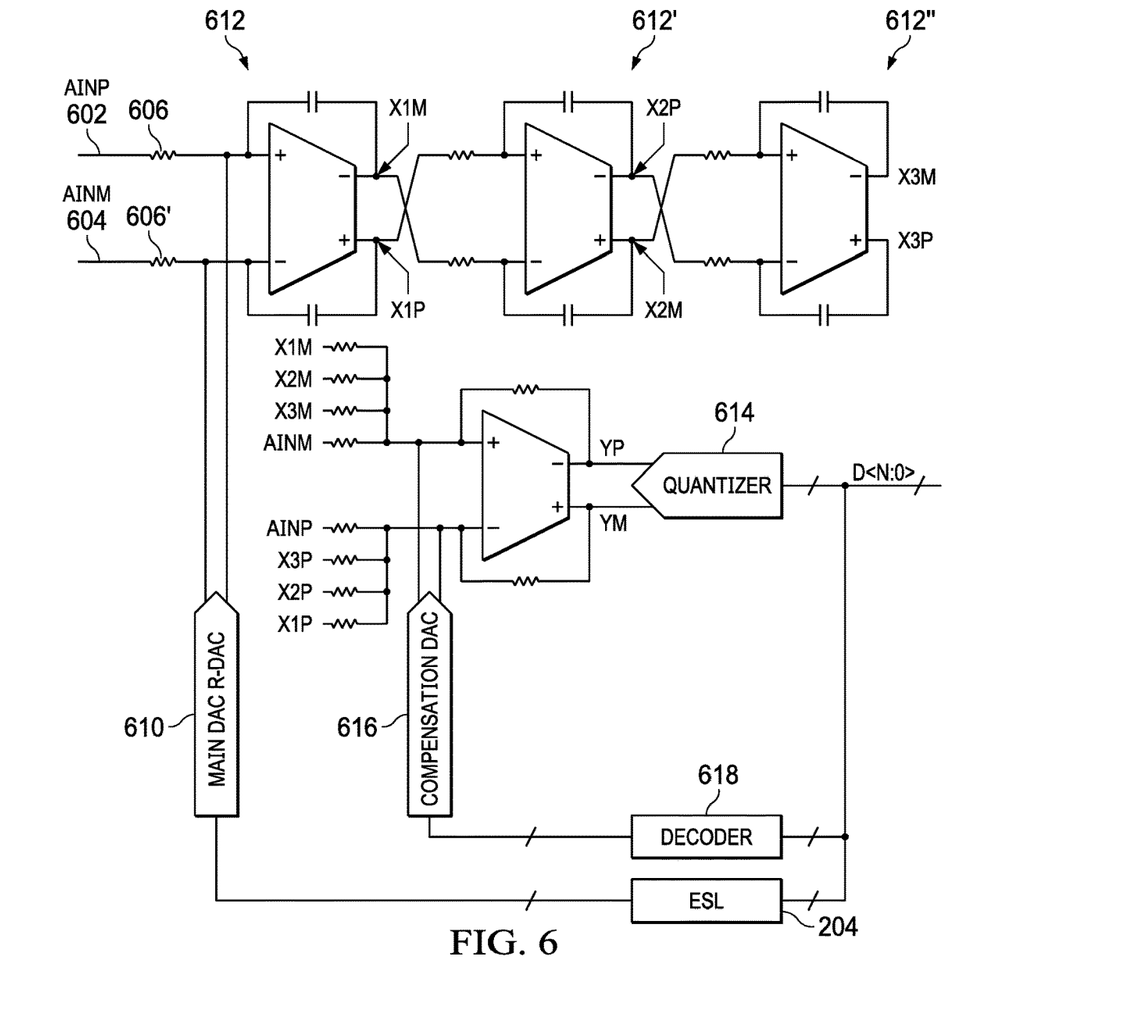
FIG. 6 is an example block diagram of the modulator system.

FIG. 6 shows the architecture of the ADC 116. AINP/M 602, 604 are the differential analog input which is digitized to D<N:0> through a delta-sigma converter. The input resistors 606, 606', main feedback DAC 610, and the integrators 612, 612', 612" form the front-end of the converter which helps improve the performance (e.g., the signal-to-noise ratio, SNR) of the ADC. The input resistors 606, 606' convert the analog input voltage to current whereas the main feedback DAC 610 takes the digital output and converts it backs to an analog signal, e.g. current, thereby closing the negative feedback loop. The error current is processed by the three cascaded integrators 612, 612', 612" and summed up to provide the input for the quantizer 614. Like any feedback system, the precision of the feedback network determines the overall accuracy of the system. Hence, the noise from the DAC may be a limiting factor. Due to finite delay in the main feedback path the loop becomes unstable. To compensate for the delay, an extra DAC is added around the fast path which is called compensation DAC 616. The decoder 618 converts the binary input to thermometric code which is also embedded in the element selection logic module (ESL) 204 of the main DAC 610. The element selection logic selects which unit elements need to be used to realize a particular DAC code.

Figure 7:
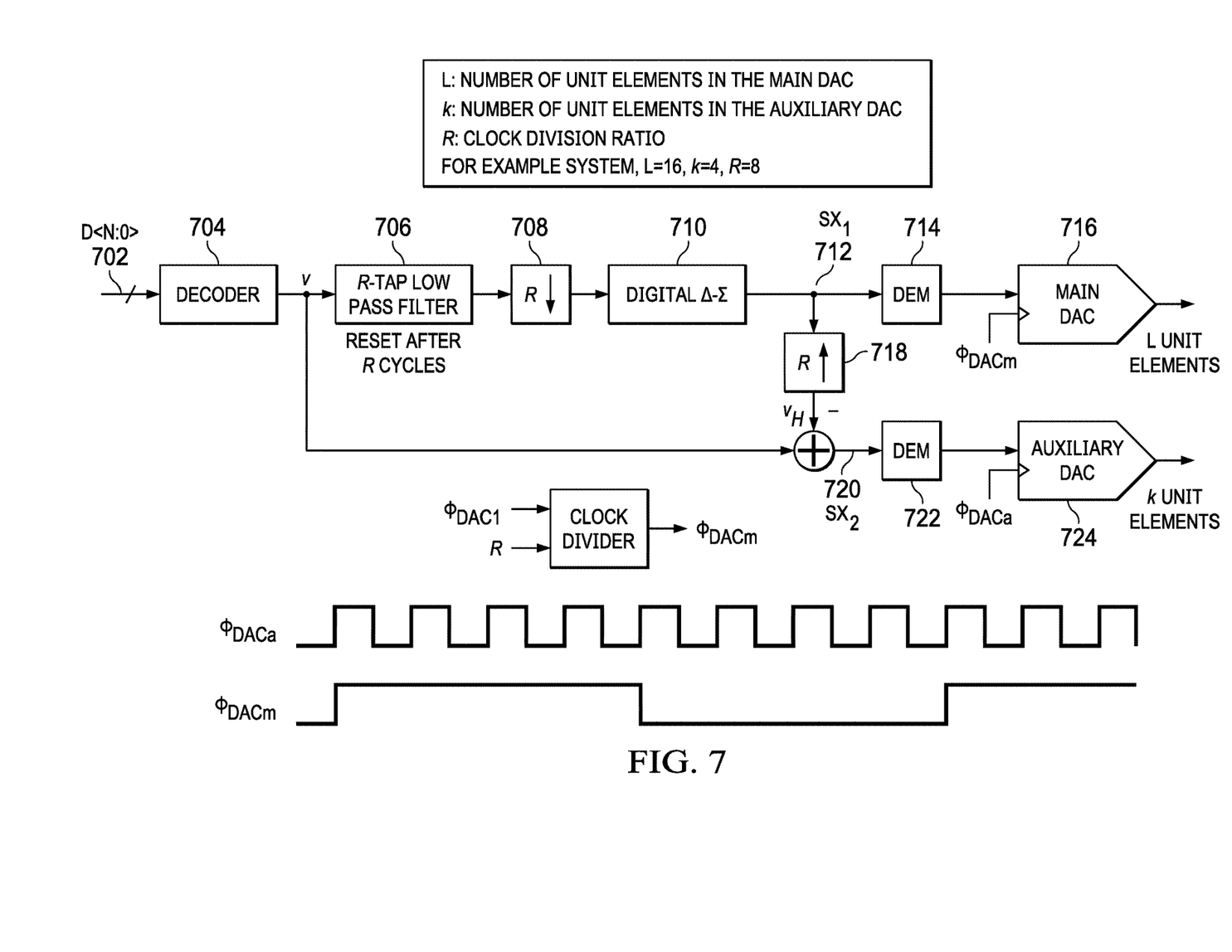
FIG. 7 is an example diagrammatic representation of the system implementing the switching algorithm.

FIG. 7 provides additional detail on the operation of the switching algorithm for the DAC's unit cells 300, 300', which are shown, for example, in FIGS. 3A and 3B. The switching algorithm may be controlled by, for example, the element selection logic module (ESL) 204. The parameter R, the clock division ratio, determines the frequency with which the elements in the Main DAC unit elements and Aux. DAC unit elements are switched. The main DAC has a certain number of unit elements, represented by "L," while the variable, "k," represents the number of unit elements in the auxiliary DAC. An equation for the switching frequency at a DAC (here, DAC2) is: $\phi_{DAC2}=\phi_{DAC1}/R$.

The choice of R is determined as follows. Lower switching frequency and hence, a higher value of R is preferred because that reduces the effect of charge injection, clock feedthrough and other the dynamic errors from the DAC. That in turn reduces the dynamic errors in the system. However, to effectively cancel the low frequency noise, the switching frequency should be higher than the low frequency noise (flicker noise) corner frequency ($f_{noise\_low}$). Thus, the maximum value of R is determined, for example by the following equation: $R=floor(\phi_{DAC1}/f_{noise\_low})$ where the minimum value is limited to 1. In the example system described herein, the value of R is chosen to be 8.

As shown in FIG. 7, the modulator output D<N:0>702 comprises a slow-moving input signal riding on top of high frequency quantization noise. That input signal passes to the decoder 704, which converts the binary input to thermometric code. A low-pass filter 706 is used to extract signal information from the input data. The filter 706 operates with a maximum of R taps and requires reset after every R cycles. At 708, the system decimates the filtered signal by R. At a digital delta-sigma modulator 710, the high bit-count input is converted to a lower bit-count output $SX_1$ 712. $SX_1$ 712 is the output of the digital delta sigma converter 710 that forms the input to the DEM logic 714 of main DAC 716. Concurrently, at $SX_1$ 712, the software obtains the input code for the auxiliary DAC 724. $SX_2$ is the input code for the auxiliary DAC, v is the input signal and $v_H$ is the upsampled version of the signal $SX_1$. That input passes to the DEM logic 722 of the auxiliary DAC 724.

As explained herein, virtual ground switching coupled with the static mismatch shaping, in general, removes the flicker noise from the DAC unit elements. However, the increased switching activity due to the mismatch shaper increases the dynamic error and leads to fold back of out-of-band noise, thereby leading to lower in-band SNR. To tackle this issue, a switching algorithm is described herein and shown in FIG. 8 and FIG. 9. The switching algorithm exploits the fact that for multi-level feedback, feedback DAC switches between a few levels, for example three to five unit elements. The system considered here uses third order noise transfer function (NTF) with a 17-level quantizer.

The technique described herein is based on the fact that the input signal is slow moving and thus a modulator output D<N:0> comprises a slow-moving input signal riding on top of high frequency quantization noise. For multi-bit modulators with reasonable number of levels, the quantization noise is limited to switching of few unit elements. Thus, the feedback can be applied through two separate DACs—one working at full rate providing the quantization noise part (auxiliary DAC) whereas the other working at a slower rate providing the signal component (main DAC). Because the input signal forms a part of the feedback, by reducing the switching frequency of main DAC, the dynamic errors can be greatly reduced. The switching frequency of the main DAC is derived as follows: $\varphi_{DACm}=\varphi_{DACa}/R$.

The two DACs have separate DEM algorithms to take care of the element mismatch and also the low frequency noise. However, mismatch between each of the DACs will create higher noise floor and distortion. To deal with this the main DAC's input is shaped by digital DSM before applying it to the DAC. For the example system, the main DAC is operated with 16-unit elements and the auxiliary DAC with 4 unit elements with a choice of R=8.

The choice of R is determined as follows. Lower switching frequency and hence, a higher value of R is preferred because that reduces the effect of charge injection, clock feedthrough and other the dynamic errors from the DAC. That in turn reduces the dynamic errors in the system. However, to effectively cancel the low frequency noise, the switching frequency should be higher than the low frequency noise (flicker noise) corner frequency ($f_{noise\_low}$). Thus, the maximum value of R is determined, for example by the following equation: $R=floor(\phi_{DAC1}/f_{noise\_low})$ where the minimum value is limited to 1. In the example system described herein, the value of R is chosen to be 8.

A larger value of R also leads to higher value of k (where k is the number of unit elements required in the auxiliary DAC) and hence increase in auxiliary DAC. So, the value of R should be chosen judiciously.

Figure 9:
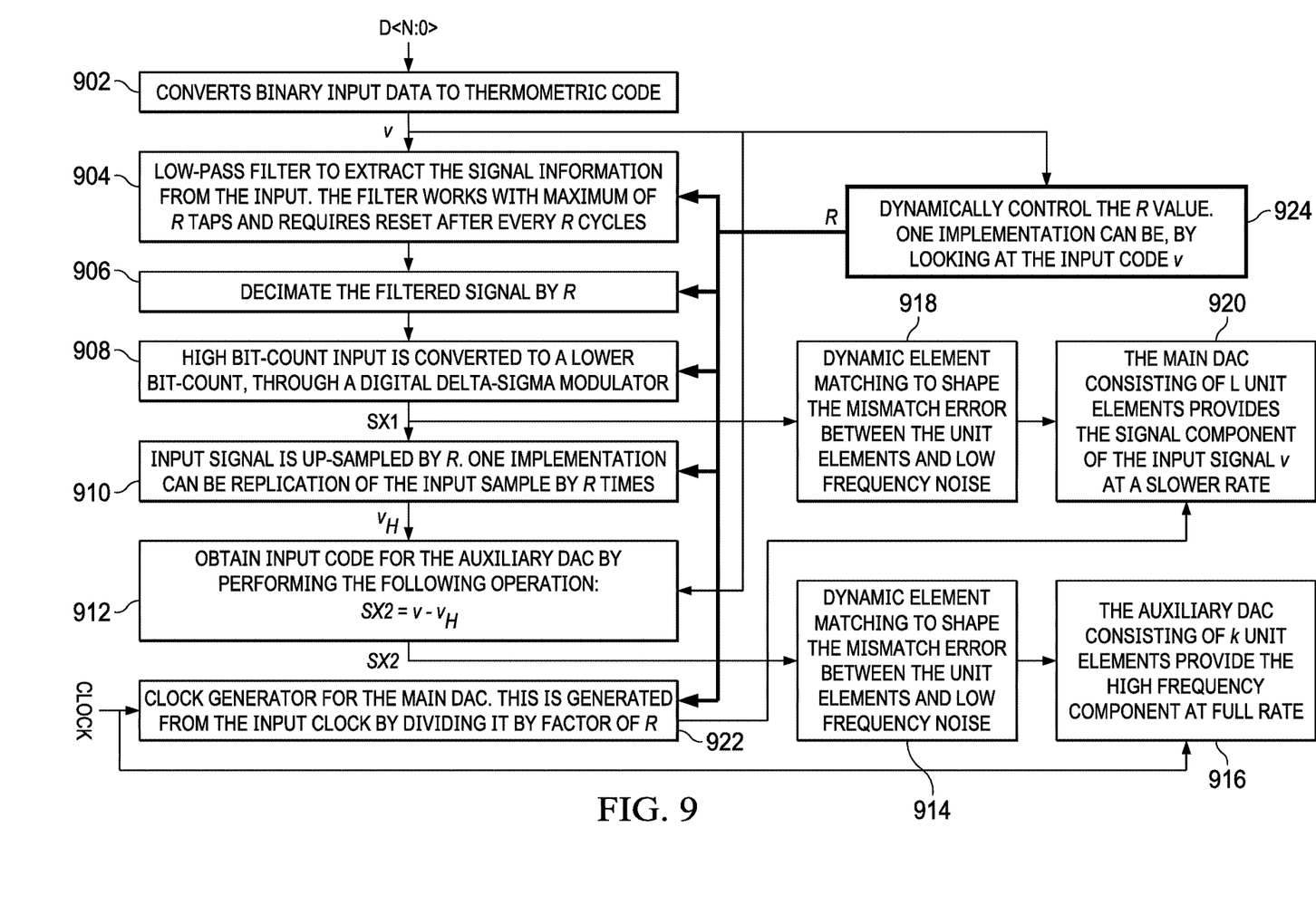
FIG. 9 is an example flowchart of the system implementing another switching algorithm.

Note that the larger R value requires larger k value only when a full-scale high frequency signal appears at the input of the DAC. This issue can be tackled by modulating the R value based on the input and thereby still using smaller value of k and hence a smaller auxiliary DAC. One such scheme is shown in FIG. 9. One implementation of the controller can be done just by looking at the value of V, the output of the binary to thermometric decoder, based on pre-determined upper and lower thresholds.

Note, although this scheme is proposed for low frequency noise shaping, it can be used in general and this also helps in reducing the dynamic errors.

Figure 8:
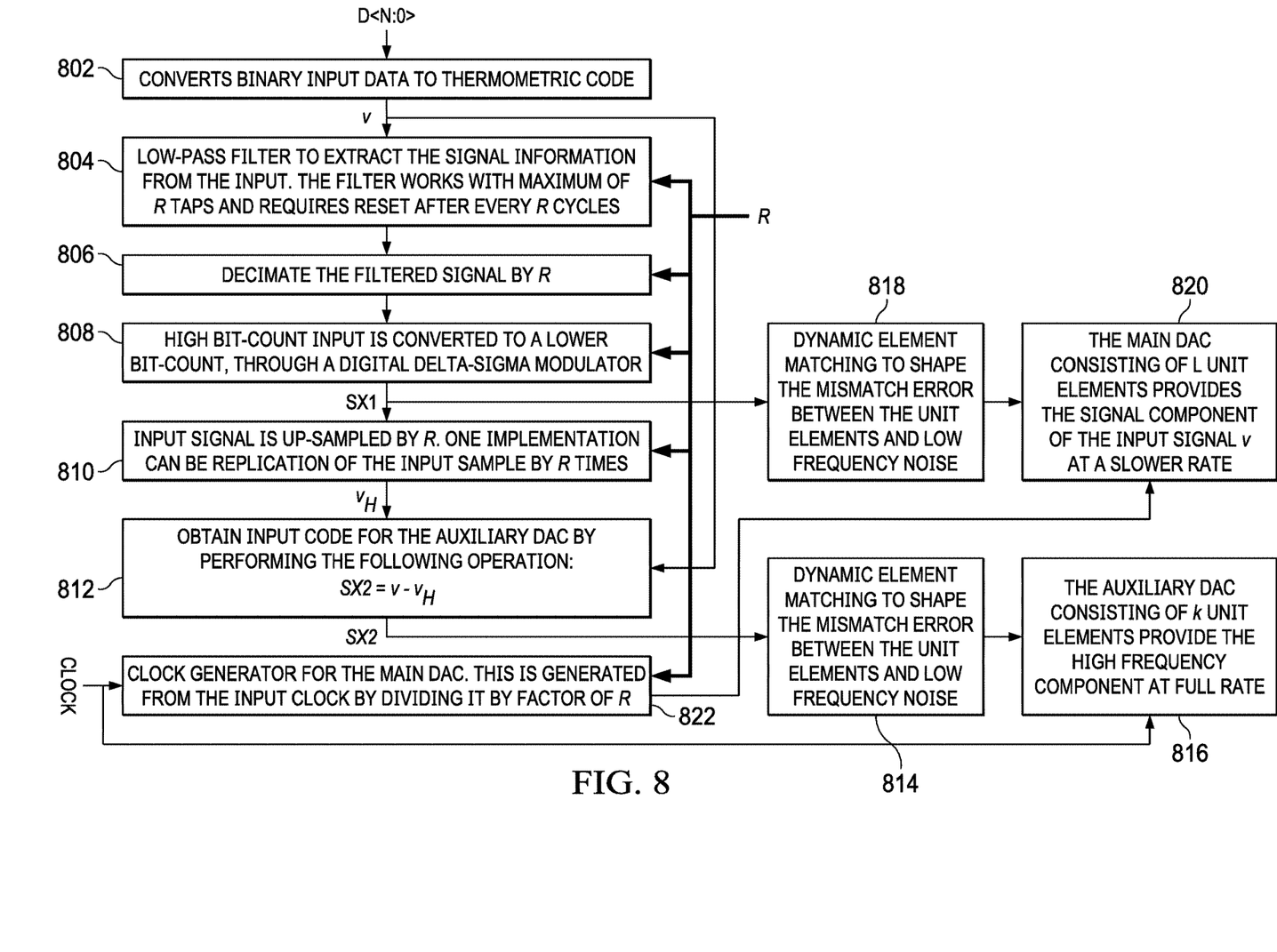
FIG. 8 is an example flowchart of the system implementing the switching algorithm.

FIG. 8 is a flowchart showing an exemplary implementation of the methods used by the technology. The method commences at step 802, where the input, a modulator output D<N:0>, is converted from binary input data to thermometric data. At step 804, a low-pass filter is used to extract signal information from the input data. The filter operates with a maximum of R taps and requires reset after every R cycles. At step 806, the system decimates the filtered signal by R. At step 808, the high bit-count input is converted to a lower bit-count using a digital delta-sigma modulator. The pathway then may progress to step 810, where the input signal is up-sampled by R. In certain implementations, this can include replication of the input sample R times. $SX_1$ is the output of the digital delta sigma converter that forms the input to the DEM logic of main DAC. Then, at step 812, the software obtains the input code for the auxiliary DAC, which may be calculated by the equation: $SX2=v-V_H$. In that equation, $SX_2$ is the input code for the auxiliary DAC, v is the input signal and $v_H$ is the upsampled version of the signal SX1. Subsequently, at step 814, dynamic element matching is used to shape the mismatch error between the unit elements and the low-frequency noise. Then at S816, the auxiliary DAC preferably consisting of k unit elements, provides the frequency component at the full rate.

Concurrently, the system pathway continues from step 808 to step 818, where dynamic element matching is used to shape the mismatch error between the unit elements and the low-frequency noise, this time at the main DAC. Then at step 820, the main DAC preferably consisting of L unit elements, provides the signal component of the input signal v at a slower rate. The calculation at step 820 also incorporates data from the clock generator of the main DAC from step 822, where the clock is generated from the input clock by dividing it by a factor of R.

FIG. 9 is a flowchart showing another exemplary implementation of the methods used by the technology. The method commences at step 902, where the input, a modulator output D<N:0>, is converted from binary input data to thermometric data. At step 904, a low-pass filter is used to extract signal information from the input data. The filter operates with a maximum of R taps and requires reset after every R cycles. At step 906, the system decimates the filtered signal by R. At step 908, the high bit-count input is converted to a lower bit-count using a digital delta-sigma modulator. The pathway then may progress to S910, where the input signal is up-sampled by R. In certain implementations, this can include replication of the input sample R times. SX1 is the output of the digital delta sigma converter that forms the input to the DEM logic of main DAC. Then, at step 912, the software obtains the input code for the auxiliary DAC, which may be calculated by the equation: $SX2=v-V_H$. In that equation, SX2 is the input code for the auxiliary DAC, v is the input signal and $v_H$ is the upsampled version of the signal SX1. Subsequently, at step 914, dynamic element matching is used to shape the mismatch error between the unit elements and the low-frequency noise. Then at step 916, the auxiliary DAC preferably consisting of k unit elements, provides the frequency component at the full rate.

Concurrently, the system pathway continues from step 908 to step 918, where dynamic element matching is used to shape the mismatch error between the unit elements and the low-frequency noise, this time at the main DAC. Then at step 920, the main DAC preferably consisting of L unit elements, provides the signal component of the input signal v at a slower rate. The calculation at step 920 also incorporates data from the clock generator of the main DAC from step 922, where the clock is generated from the input clock by dividing it by a factor of R. In the implementation, at step 924, the value of R is dynamically controlled, such that in certain embodiments, it may be calculated using the input code v.

Modifications are possible in the described embodiments, and other embodiments are possible, within the scope of the claims. In describing the examples in the drawings, specific terminology will be resorted to for the sake of clarity. However, the examples are not intended to be limited to the specific terms so selected, and it is to be understood that each specific term includes all technical equivalents that operate in a similar manner to accomplish a similar purpose. Several examples are described for illustrative purposes, but the principles described herein may be embodied in other forms not specifically shown in the drawings. In this description, the term "couple" or "couples" means either an indirect or direct wired or wireless connection. Thus, if a first device couples to a second device, that connection may be through a direct connection or through an indirect connection via other devices and connections.

What is claimed is:

1. A method for shaping low frequency noise comprising:
   converting a binary input to a thermometric code;
   extracting signal information from the thermometric code;
   decimating the signal information;
   converting the signal information into a lower bit-count signal;
   upsampling the lower bit-count signal;
   applying mismatch shaping on a plurality of unit elements in the lower bit-count signal at a first DAC; and
   outputting from the first DAC a signal component of the lower bit-count signal.

2. The method of claim 1, further comprising implementing the decimation ratio using a clock division value, R.

3. The method of claim 2, further comprising dynamically controlling the clock division value R based on an input code associated with the binary input.

4. The method of claim 2, further comprising using a frequency for the mismatch shaping that is derived from an input clock using the decimation ratio calculated by: R=floor ($\phi_{DAC1}/f_{noise\_low}$), wherein $\phi_{DAC1}$ represents the frequency of the input clock used by a switching controller and R has a minimum value.

5. The method of claim 1, further comprising obtaining an input code for a second DAC.

6. The method of claim 5, further comprising matching the shape of a mismatch error between a plurality of unit elements in the lower bit-count signal for the second DAC.

7. The method of claim 5, further comprising outputting from the second DAC a frequency component of the lower bit-count signal at a full rate.

8. The method of claim 1, further comprising using a low-pass filter to extract signal information from the thermometric code.

9. The method of claim 1, further comprising using a digital delta-sigma to convert the signal information into the lower bit-count signal.

10. A signal convertor, comprising:
    a first resistor;
    a first transistor;
    a second transistor coupled to the first transistor and to the first resistor, the first transistor coupled to a positive virtual ground node and the second transistor coupled to a negative virtual ground node;
    an element selection logic module coupled to the first and second transistors, the element selection module configured to switch a binary input from the positive virtual ground node (VGP) to the negative virtual ground node (VGN) through:
    conversion of the binary input to a thermometric code;
    extraction of signal information from the thermometric code;
    decimation of the signal information;
    conversion of the signal information into a lower bit-count signal;
    upsampling of the lower bit-count signal;
    application of mismatch shaping on a plurality of unit elements in the lower bit-count signal at a first digital-to-analog convertor (DAC); and
    cause the first DAC to output a signal component of the lower bit-count signal.

11. The signal convertor of claim 10, wherein the decimation ratio is uses a clock division value, R.

12. The signal convertor of claim 11, wherein the element selection logic module is configured to dynamically control the clock division value R based on an input code associated with the binary input.

13. The signal convertor of claim 11, wherein the mismatch shaping uses a frequency that is derived from an input clock using the decimation ratio calculated by: R=floor ($\phi_{DAC1}/f_{noise\_low}$), wherein $\phi_{DAC1}$ represents the frequency of the input clock used by a switching controller and R has a minimum value.

14. The signal convertor of claim 10, wherein the element selection logic module is further configured to obtain an input code for a second DAC.

15. The signal convertor of claim 14, wherein the element selection logic module is further configured to match the shape of a mismatch error between a plurality of unit elements and a low frequency noise in the lower bit-count signal for the second DAC.

16. The signal convertor of claim 14, wherein the first and second element selection logic module is further configured to cause an output from the second DAC of a frequency component of the lower bit-count signal at a full rate.

17. The signal convertor of claim 10, further comprising a low-pass filter, wherein the low pass filter is configured to extract signal information from the thermometric code.

18. The signal convertor of claim 10, further comprising a digital delta-sigma modulator coupled to the first and second transistors, wherein said digital delta-sigma modulator is configured to convert the signal information into the lower bit-count signal.

19. A signal convertor comprising:
    a digital-to-analog convertor comprised of a plurality of unit elements, wherein each of the unit elements comprises:
    a first resistor;

a second resistor;
a first transistor;
a second transistor;
a third transistor; and
a fourth transistor; wherein
the first transistor is coupled to the first resistor at a virtual positive ground node and the second transistor coupled to the first resistor at a virtual negative ground node; and
the third transistor is coupled to the second resistor at the virtual positive ground node and the fourth transistor is coupled to the second resistor at the virtual negative ground node.

20. The signal convertor of claim 19, wherein the first transistor, the second transistor, the third transistor, and the fourth transistor are configured to switch an input from the virtual negative ground node to the virtual positive ground node.

* * * * *